(12) United States Patent
Trae

(10) Patent No.: US 12,341,274 B2
(45) Date of Patent: Jun. 24, 2025

(54) CONNECTOR MOUNTING ONE OR MORE CABLES TO A PRINTED CIRCUIT BOARD

(71) Applicant: MD ELEKTRONIK GmbH, Waldkraiburg (DE)

(72) Inventor: Johannes Trae, Muehldorf am Inn (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 378 days.

(21) Appl. No.: 17/888,528

(22) Filed: Aug. 16, 2022

(65) Prior Publication Data
US 2023/0063714 A1 Mar. 2, 2023

(30) Foreign Application Priority Data

Aug. 30, 2021 (DE) .................. 10 2021 122 329.6

(51) Int. Cl.
| | |
|---|---|
| *H01R 12/51* | (2011.01) |
| *H01R 43/20* | (2006.01) |
| *H05K 1/18* | (2006.01) |
| *H05K 3/30* | (2006.01) |

(52) U.S. Cl.
CPC .......... *H01R 12/515* (2013.01); *H01R 43/205* (2013.01); *H05K 1/181* (2013.01); *H05K 3/303* (2013.01); *H05K 2201/10189* (2013.01)

(58) Field of Classification Search
CPC ..................................... H01R 12/515–43/205
See application file for complete search history.

(56) References Cited

U.S. PATENT DOCUMENTS

| | | | | |
|---|---|---|---|---|
| 5,347,711 | A | * | 9/1994 | Wheatcraft ............ H05K 3/301 29/843 |
| 5,532,659 | A | | 7/1996 | Dodart |
| 5,931,692 | A | * | 8/1999 | Medina ............... H01R 43/0256 29/843 |
| 9,548,549 | B1 | * | 1/2017 | Masuyama .......... H01R 12/598 |
| 2007/0054510 | A1 | | 3/2007 | Price |
| 2021/0006012 | A1 | | 1/2021 | Kajiura et al. |

FOREIGN PATENT DOCUMENTS

| | | |
|---|---|---|
| DE | 102008020969 A1 | 11/2009 |
| EP | 2690712 A2 | 1/2014 |
| FR | 2860945 A1 | 4/2005 |
| JP | 2018045924 A | 3/2018 |
| WO | WO 02084808 A1 | 10/2002 |
| WO | WO 2016104586 A1 | 6/2016 |

* cited by examiner

*Primary Examiner* — Vanessa Girardi
(74) *Attorney, Agent, or Firm* — LEYDIG, VOIT & MAYER, LTD.

(57) ABSTRACT

A connector for connecting a printed circuit board, which comprises a solder pad, to a conductor of a line includes one or more fasteners, a recess and a second opening. The connector is fastenable to the printed circuit board by the one or more fasteners. The recess is formed on a first side of the connector and extends at least over a second side arranged transversely to the first side. In an assembled state of the connector on the printed circuit board, the solder pad is arrangeable in the recess on the first side, and, on the second side, the recess forms a first opening into which the conductor is insertable. The second opening is formed on a third side opposite the first side. Heat for connecting the at least one conductor to the solder pad is providable through the second opening.

18 Claims, 4 Drawing Sheets

CONNECTOR MOUNTING ONE OR MORE CABLES TO A PRINTED CIRCUIT BOARD

CROSS REFERENCE TO RELATED APPLICATION

This application claims benefit to German Patent Application No. DE 10 2021 122 329.6, filed on Aug. 30, 2021, which is hereby incorporated by reference herein.

FIELD

The invention relates to a connector and to a method for connecting a printed circuit board to at least one conductor, and to a printed circuit board to be directly connected to at least one conductor.

BACKGROUND

When establishing an electrical connection between a conductor of a line and a printed circuit board, the prior-art connection technology often features multiple and/or bulky components.

Document WO 02/084808 A1 describes a printed circuit board connector for receiving a cable end, which connector is configured such that it can be fastened to a printed circuit board. The printed circuit board connector has a through-hole into which the cable end is inserted and through which the inner conductor is threaded, the inner conductor being soldered to a micro strip conductor on the printed circuit board outside the printed circuit board connector.

Document EP 2 690 712 A2 describes a connection device for connecting a high-frequency coaxial cable to a printed circuit board. The printed circuit board comprises a cut-out region, in which one part of an edge has been cut out, and a pair of through-holes formed on both sides of the cut-out region. The cut-out region is formed at a predetermined position on the perimeter of the printed circuit board and comprises an opening that opens outward whereas the through-holes comprise closed openings having a circular shape. The cut-out region is a space in which a central body of the soldering block and the high-frequency coaxial cable are arranged and soldered, whereas the through-holes are spaces in which auxiliary bodies of the soldering block are inserted and soldered.

Document US 2007/054510 A1 describes systems and methods for connecting coaxial cables to conductors on a printed circuit board. In particular, the document describes a device for connecting a coaxial cable to a printed circuit board, the device comprising a connector that comprises an electrically conductive element having a receptacle that receives one end of the coaxial cable in order to connect the coaxial cable to a conductor on the printed circuit board, and comprising a shield that is directly connected to the connector and the printed circuit board in order to prevent parasitic radiation.

Document US 2021/0006012 A1 describes a printed circuit board connector comprising an assembly interface that is configured for assembly on the surface of a printed circuit board; the printed circuit board connector may comprise a recess for receiving a complementary connector for connecting a plurality of wires.

SUMMARY

In an embodiment, the present invention provides a connector for connecting a printed circuit board, which comprises at least one solder pad, to at least one conductor of a line. The connector comprises one or more fasteners, a recess and a second opening. The connector is fastenable to the printed circuit board by the one or more fasteners. The recess is formed on a first side of the connector and extends at least over a second side arranged transversely to the first side. In an assembled state of the connector on the printed circuit board, the at least one solder pad is arrangeable in the recess on the first side, and, on the second side, the recess forms a first opening into which the at least one conductor is insertable. The second opening is formed on a third side opposite the first side. Heat for connecting the at least one conductor to the at least one solder pad is providable through the second opening.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
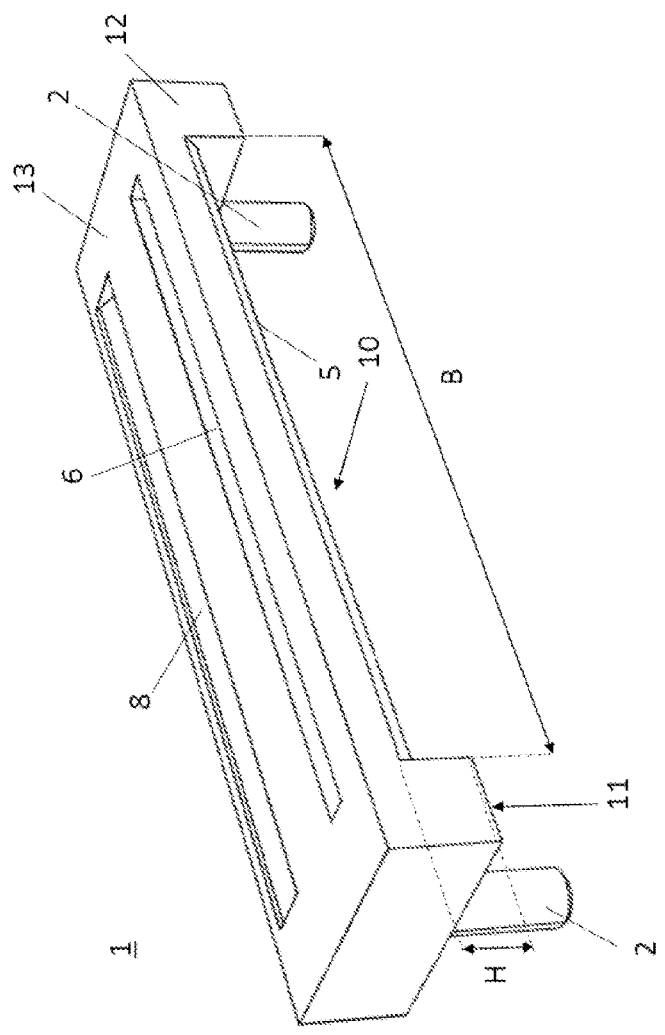
FIG. 1 is a perspective view of an embodiment example of a connector.

It has been recognized according to embodiments of the present invention that the prior-art systems take up significant amounts of installation space on the printed circuit board and are often associated with additional, but necessary elements and increased processing effort.

Embodiments of the present invention provide a device and a method for connecting a printed circuit board to at least one conductor, in which the best-possible connection is established, preferably in an automated manner, while using few components and assembly steps and taking up very little installation space.

In particular, the device and method for connecting a printed circuit board to at least one conductor, in which the best-possible connection is established, preferably in an automated manner, while using few components and assembly steps and taking up very little installation space is achieved by embodiments of the present invention by a connector for connecting the printed circuit board, which comprises at least one solder pad, to the at least one conductor of a line, comprising one or more fasteners, by means of which the connector can be fastened to the printed circuit board, a recess, which is formed on a first side of the connector and extends at least over a second side arranged transversely to the first side, wherein, when the connector is in an assembled state on the printed circuit board, the at least one solder pad can be arranged in the recess on the first side and the recess forms, on the second side, a first opening into which the at least one conductor can be inserted, and comprising a second opening formed on a third side opposite the first side, wherein heat for connecting the at least one conductor to the at least one solder pad can be provided through the second opening.

The connector is a fabrication aid for establishing a permanent, electrically conductive connection between a printed circuit board and at least one conductor. In this case, the connection is a direct connection, i.e., without a port or plug system. The advantage of the direct connection is that fewer components are required and less installation space has to be provided. In addition, the connection can be set up in just a few steps and also in an automated manner. In automated manufacturing, the contact pressure required for reliably connecting the printed circuit board and the connector can be ensured by pick-and-place machines. The printed circuit board is used as the primary solder repository for the connection, and the fabrication aid is also required only on the printed circuit board. The line to be connected, or the at least one exposed conductor, need not necessarily be pretreated. This saves time and allows for processing in confined spaces.

Preferably, the connector is configured to connect a plurality of conductors to a corresponding plurality of solder pads in parallel, the first opening in particular having a width that is suitable for receiving the plurality of conductors in parallel. A plurality of conductors can comprise more than five, in particular more than ten, conductors. Owing to the shape of the connector, in particular the width of the first opening, a plurality of conductors can be connected to the printed circuit board close together. This allows the connector, and the connection as a whole, to be constructed in a compact and space-saving manner.

Preferably, in the assembled state, at least one side of the first opening is formed by the printed circuit board. As a result, the inserted conductor can be arranged as close as possible to the printed circuit board, i.e., only the solder pad is then located between the conductor and printed circuit board. This permits a space-saving connection that requires little installation space.

Preferably, the one or more fasteners comprises pins or pegs that can engage in corresponding openings in the printed circuit board. The pins or pegs, or a similar fastener (s), give the assembler, or a pick-and-place system of an automated machine, very clear visual and/or haptic feedback, thereby making it simpler to arrange the connector on the printed circuit board. In addition, the arrangement and number of fasteners can predetermine an orientation of the connector on the printed circuit board. The pins or pegs can provide a permanent or releasable connection in a simple and reliable manner.

Preferably, the connector comprises adhesive surfaces on the first side. The adhesive surfaces can form additional or alternative fasteners. The adhesive surfaces can be applied to the connector and/or to the printed circuit board using adhesive dots. The adhesive surfaces secure the fastening of the connector to the printed circuit board.

Preferably, in the assembled state, a height of the first opening corresponds to a diameter of the at least one conductor. In the assembled state, an inserted conductor occupies substantially the entire height of the opening or recess such that the connector is only as tall as necessary. In this case, "substantially" means that there need only be further space for a solder pad, and an insertion aid can be provided on the outer edge of the first opening. Owing to the height of the first opening, the connector can be configured to be very flat, so only a small amount of installation space is needed.

Preferably, the first opening has at least one insertion aid. The insertion aid makes it simpler to insert conductors into the first opening. Since the diameter of the inserted conductors is generally only fractions of millimeters, for example in a range from 0.1 to 0.9 mm, an insertion aid is very advantageous.

Preferably, the first opening has at least one orientation means. The orientation means makes it simpler to arrange conductors in the connector in a directional manner. This can ensure that the conductors are arranged consistently in the connector or on the soldering pads.

Preferably, the connector further comprises a third opening formed on the third side, it being possible to supply a medium to the at least one conductor and to the at least one solder pad through the third opening. The third opening is preferably spaced apart from the second opening and forms a further access to the recess in the connector, the recess forming a cavity in the assembled state. The third opening can be used independently of any heat supply at the second opening.

Preferably, the third opening forms or has a repository for the medium. Preferably, the repository is filled with a particular amount of medium before the connector is arranged on the printed circuit board. In the process, when in the repository of the connector, the medium is preferably solid at room temperature, i.e., without any explicit supply of heat, for example during soldering. The advantage of having the repository on the connector is that no medium has to be provided to the connector from the exterior when the conductors are being connected or soldered. Processes can thus be made simpler.

Preferably, the connector is made of a non-heat-conducting material. If the connector is made of a non-heat-conducting material, the heat supplied during soldering need only be provided to the conductors and the solder pads through the second opening. This allows heat to be admitted to the connector in a directional manner. Admitting heat in a directional manner ensures reliable soldering and can be more energy-efficient since no undesirable heat diffusion occurs.

Furthermore, the above problems are solved in particular by a printed circuit board comprising at least one solder pad and a connector such that the printed circuit board can be directly connected to at least one conductor of a line. The direct connection does not require any port or plug systems, so it functions with just a few components and is space-saving. In this case, due to its frame structure, which is similar to a housing, the connector provides protection for the connection surfaces between the conductors and solder pads.

Furthermore, the above-mentioned problems are solved in particular by a method for connecting a printed circuit board, which comprises at least one solder pad, to at least one conductor of a line, the method comprising the following steps: arranging a connector at a predetermined position on the printed circuit board, wherein fasteners of the connector engage with the printed circuit board and the at least one solder pad is arranged in a recess in the connector, inserting the at least one conductor into a first opening in the connector, wherein the insertion movement is preferably directed along the printed circuit board plane such that an inserted conductor is in contact with a solder pad inside the connector, and introducing heat through a second opening in the connector such that an inserted conductor is connected to a solder pad with which it is in contact.

In just a few steps, the method allows a reliable electrical connection between at least one conductor and a printed circuit board. No loose contacts occur over time. The steps can be carried out manually or in an automated manner. This allows for efficient manufacture.

During the step of inserting the at least one conductor, the inserted conductor is preferably pushed, at least in part, into the solder pad. By pushing a conductor, at least in part, into a solder pad, the conductor is fixed more securely in the connector due to the adhesive property of the solder pad, which is preferably made of a solder paste. Therefore, before inserted conductors are permanently secured to the printed circuit board by soldering or the like, they remain secured in the connector even in the event of small (pulling) movements on the line.

Preferably, the method further comprises the step of: introducing a medium that assists the connection between the at least one solder pad and the at least one inserted conductor, the medium preferably being introduced through a third opening in the connector. Preferably, the medium is introduced passively when the heat is admitted at the second opening. Since the heat supplied through the second opening can also spread into the third opening from inside via the recess, the medium can be liquefied by the heat and can reach the solder pads and the inserted conductors in the recess under the effect of gravity. The medium assists the connection between the solder pads and conductors due to its chemical properties such that a reliable connection can be established.

Embodiment examples will be described in detail below with reference to the drawings.

FIG. 1 shows a first embodiment example of a connector 1. The connector 1 is suitable for directly fastening and electrically contacting at least one conductor 32 to a printed circuit board 20. The term 'direct' means without using a plug or port system. To be used, the connector 1 is fastened to the printed circuit board 20. In principle, it is possible to arrange connectors 1 both on the top 22 and on an underside of a printed circuit board 20. The fastening can be achieved manually or in an automated/mechanized manner. For the fastening, the connector 1 comprises one or more fasteners 2. In FIG. 1, the fasteners 2 comprise two pegs or pins that are suitable for engaging in corresponding openings or recesses in the printed circuit board 20 and for forming a durable connection. In alternative embodiment examples, the fasteners 2 can also comprise just one or a plurality of fasteners 2. Preferably, the fasteners 2 allow the connector 1 to be arranged on the printed circuit board 20 in a directional manner. The fasteners 2 can comprise additional clamping or latching elements, or have an interlocking or mushroom-shaped configuration. For example, the pegs shown in FIG. 1 have a mushroom shape at their free ends. Furthermore, in addition or alternatively to the above-mentioned fasteners 2, the connector 1 can be fastened to the printed circuit board 20 by adhesive surfaces on a first side 11 of the connector 1.

Figure 2:
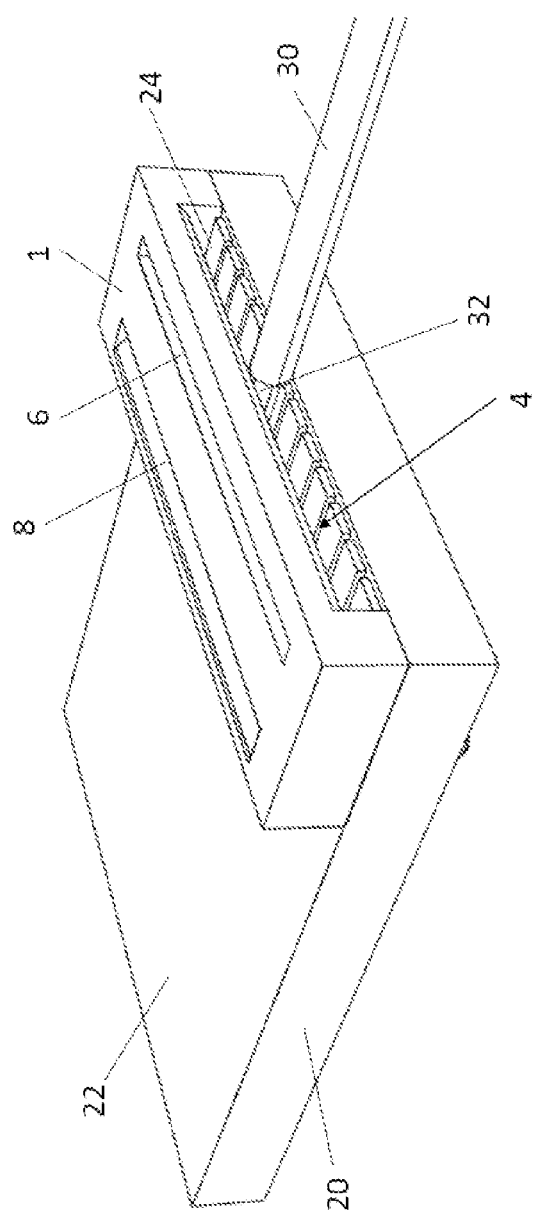
FIG. 2 is a perspective view of an embodiment example of a printed circuit board comprising a connector fastened thereto and a line inserted into the connector.
Figure 3:
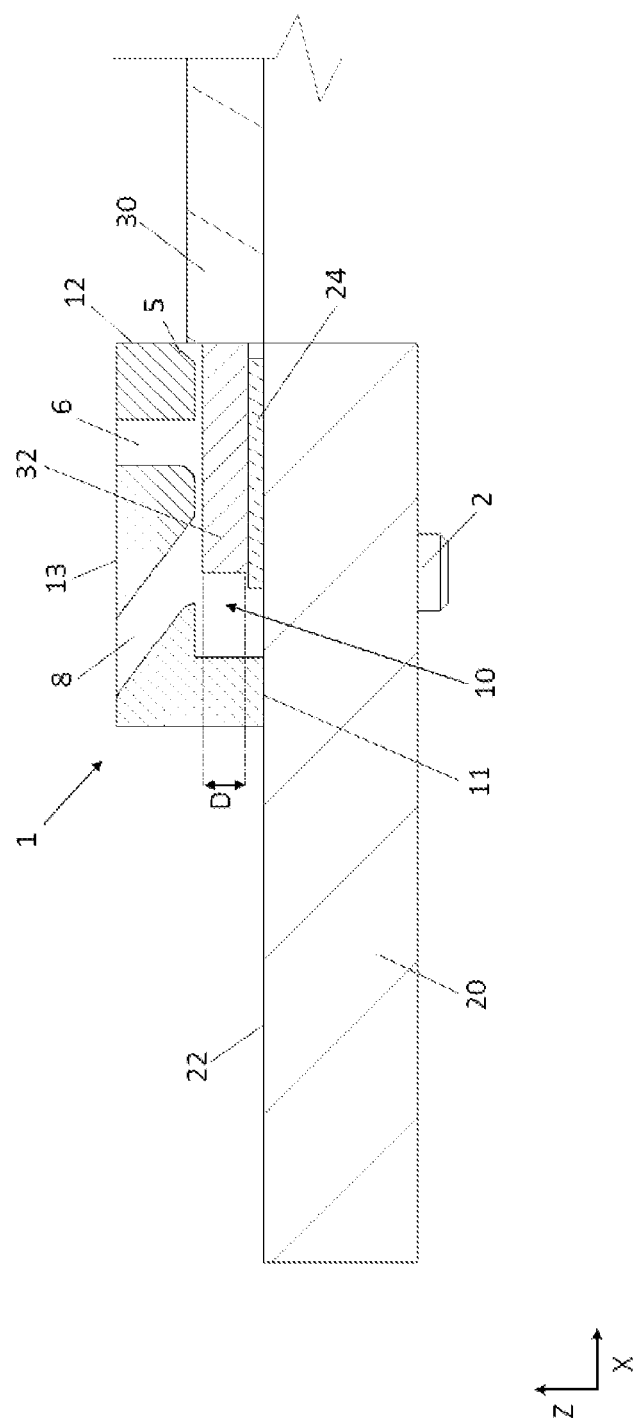
FIG. 3 is a cross-sectional view of the illustration from FIG. 2.

The connector 1 forms a kind of frame structure. In particular, the connector 1 can be placed on a surface or on a suitable object by its recess 10 and encompass the surface or object on multiple sides. Owing to this encompassing, access to the surface or object is limited and predetermined. In addition, the connector 1 protects the surface or object against undesirable external influences. In the embodiment example shown, a solder pad 24 or a plurality of solder pads 24 on the printed circuit board 20 is/are an object that is encompassed by the printed circuit board 20 and the connector 1 once the connector 1 has been placed on the printed circuit board 20 (see FIGS. 2 and 3). The printed circuit board 20 can also be referred to as a PCB. Solder pads 24 are electrically conductive contact surfaces. By means of the solder pads 24, an electrical connection can be established between a conductor 32 and the conductive tracks on the printed circuit board 20.

A conductor 32 may or should access the solder pad 24 or the plurality of solder pads 24 from the exterior through a first opening 4. The first opening 4 is a portion of the recess 10 in the connector 1. The portion of the recess 10 is delimited by the printed circuit board 20, thereby forming the first opening 4. The first opening 4 preferably has a height H that substantially corresponds to the diameter D of a conductor 32 to be inserted into the connector 1. The expression "substantially" includes tolerances, so, for example, there is also space for the solder pad 24 in addition to the conductor 32 (see FIG. 3). In addition, the outer edge of the first opening 4 can have a slightly greater height, which is then reduced using at least one insertion aid 5. The slightly greater height at the side edge in conjunction with the at least one insertion aid 5, which is preferably formed as an insertion bevel, makes it easier to insert a conductor 32 into the connector 1. Additional insertion aids 5 or insertion bevels can also be formed at other side edges of the first opening 4, in particular also on the printed circuit board 20.

The at least one line 30, which is to be connected to the printed circuit board 20 using the connector 1, preferably comprises a single-core line 30 having a conductor 32. In alternative embodiment examples, multi-core lines can also be connected to the printed circuit board 20 using the connector 1. The conductor 32 preferably comprises a core, a stranded core, or a wire of the line 30. Particularly after prefabrication, which includes, among other things, stripping the conductor insulation or the shield conductor/outer conductor, and the dielectric, the line 32 is exposed in one portion of a line end. In particular, the connector 1 is configured to reliably connect very thin stranded cores to the printed circuit board 20 since no additional plug systems are needed. The width B of the first opening 4 is preferably adapted to the number of solder pads 24 on the printed circuit board 20 and thus to the maximum number of conductors 32 to be connected. In a preferred embodiment, the width B of the first opening 4 is selected such that the lines 30 to be connected to the printed circuit board 20 are arranged in a manner closely lined up next to each other while the conductors 32 are each arranged in the connector 1 on a separate solder pad 24 spaced apart from one another (see FIG. 2). The line 30 can also include a coaxial line, in which case the outer conductor shield is coupled outside the printed circuit board 20. Preferably, the stripping edge of the line 30 is located on or aligned with an edge of the printed circuit board 20.

The at least one solder pad 24 preferably comprises a solder paste or the like. When a conductor 32 is inserted into the connector 1, the conductor 32 comes directly into contact with the solder pad 24. In particular, the conductor 32 is pushed, at least in part, into the solder pad 24 when inserted. Owing to the paste-like substance of the solder pad 24, the inserted conductor 32 is held on the solder pad 24 by friction or adhesion forces. The solder pad 24 pre-secures the inserted conductor 32 on the connector 1. The at least one solder pad 24 is preferably mounted on the printed circuit board 20 before arranging the connector 1. The number and arrangement of the at least one solder pad 24 is determined by the footprint rules of the printed circuit board 20. In particular, the at least one solder pad 24 can be pretreated and/or surface-treated and can thus provide a repository for soldering the solder pad 24 and the conductor 32 together. Once the conductor 32 has been introduced into the connector 1, the conductor 32 is located in the middle of the assigned solder pad 24 provided for this purpose, preferably as parallel as possible to the printed circuit board 20.

To connect the conductor 32 to the printed circuit board 20 permanently and establish an electrical connection, the conductor 32 is preferably soldered to the solder pad 24. For soldering, the conductor 32 is preferably pretreated and/or surface-treated, for example tin-plated. In addition, heat for soldering is introduced into the connector 1 through a second opening 6. The second opening 6 is formed substantially over the width B of the first opening 4 such that the heat can be introduced to all the inserted conductors 32, either in a manner targeted to individual conductors 32 or extensively. The heat can be supplied either directly or indirectly, for example via laser or infrared oscillations. If the connector 1 is made of a non-heat-conducting material, the second opening 6 constitutes the only place at which heat can be introduced into the connector 1 to solder the conductors 32. Particularly in the case of multi-row connectors, the connector 1 can be made of heat-conducting material in order to transmit the heat over an extensive area and produce reliable connections.

In addition, a medium can be supplied to the connector 1 through a third opening 8. The medium can assist soldering and/or supplement the pretreatment of the solder pad 24 and/or of the conductor 32. In particular, the third opening 8 can comprise a solder repository in which the medium can be stored. The solder repository can be the third opening 8 itself or a separate store. In a preferred embodiment example, the medium is solid in the third opening 8 before soldering. During soldering, the medium liquefies due to the heat produced in the connector 1 and gradually moves into the connector 1 to the soldering site.

Figure 4:
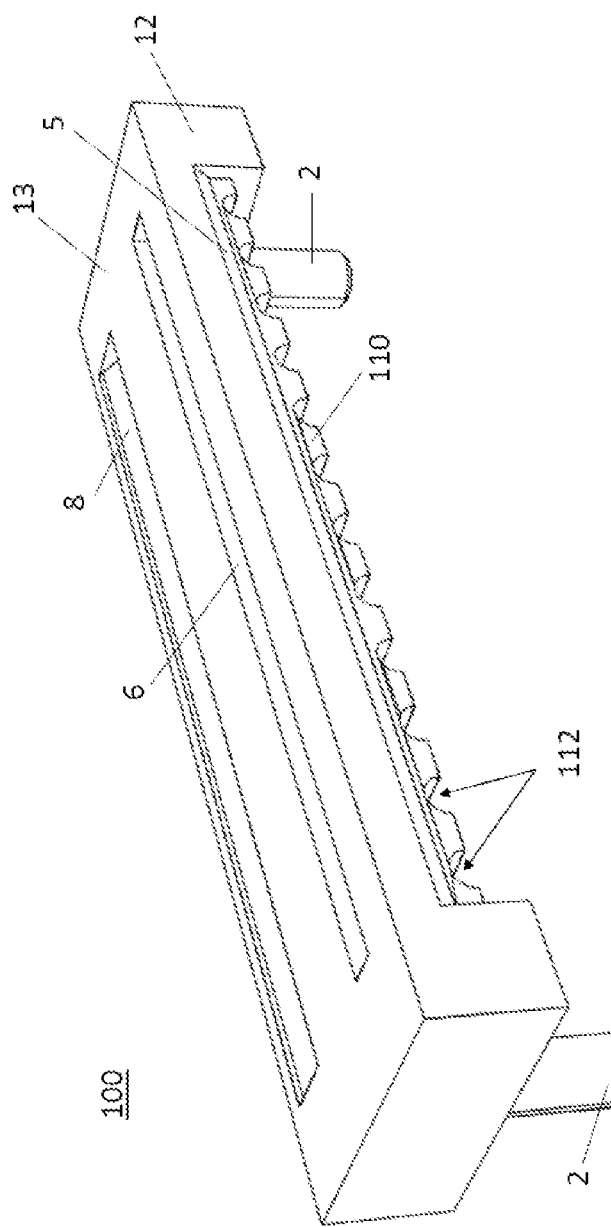
FIG. 4 is a perspective view of a second embodiment example of a connector.

FIG. 4 shows a second embodiment example of a connector 100. The second embodiment example of the connector 100 in particular comprises orientation means 110 for orienting the at least one conductor 32 in the connector 100 or for inserting it in a directional manner. The orientation means 110 preferably comprise semicircles 112 or a rail having an open curved/arcuate profile. Owing to the semicircles 112 or the profile, each conductor 32 can be arranged in the connector 100 at a particular location and in a manner uniformly spaced apart from one another. The orientation means 110 is preferably integral with the connector 100. In an alternative embodiment example, the orientation means 110 can be fastened to the connector 100 as a separate component. The number of semicircles 112 preferably corresponds to the number of solder pads 24 in the connector 100 on the printed circuit board 20.

The connector 1 is preferably made of an electrically non-conductive material, in particular a plastics material.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Connector
2 Fasteners
4 First opening
5 Insertion aid
6 Second opening
8 Third opening
10 Recess
11 First side
12 Second side
13 Third side
20 Printed circuit board
22 Top
24 Solder pad
30 Line
32 Conductor
100 Connector
110 Orientation means
112 Semicircle
B Width
D Diameter
H Height
X, Y, Z Axial directions

What is claimed is:
1. A printed circuit board, comprising:
at least one solder pad, and
a connector for connecting the printed circuit board to at least one conductor of a line, the connector comprising:
a) one or more fasteners, by which the connector is fastened to the printed circuit board in an assembled state of the connector on the printed circuit board;
b) a recess, which is formed on a first side of the connector and extends at least over a second side arranged transversely to the first side, wherein, in the assembled state of the connector on the printed circuit board, the at least one solder pad is arranged in the recess on the first side, and, on the second side, the recess forms a first opening into which the at least one conductor is inserted in an inserted state of the at least one conductor; and
c) a second opening formed on a third side opposite the first side, wherein heat for connecting the at least one conductor to the at least one solder pad is providable through the second opening,
wherein the at least one conductor comprises a core, a stranded core or a wire of the line extending from a stripping edge of the line, and
wherein the first opening is arranged at a side edge of the printed circuit board in the assembled state of the connector on the printed circuit board and has a height of corresponding to a diameter of the at least one conductor such that the stripping edge of the line abuts the side edge of the printed circuit board in the inserted state of the at least one conductor.

2. The printed circuit board according to claim 1, wherein the connector is configured to connect a plurality of conductors to a corresponding plurality of solder pads in parallel, and wherein the first opening has a width that is configured to receive the plurality of conductors in parallel.

3. The printed circuit board according to claim 1, wherein, in the assembled state of the connector on the printed circuit board, a bottom side of the first opening is formed by the printed circuit board.

4. The printed circuit board according to claim 1, wherein the one or more fasteners comprise pins or pegs that are configured to engage in corresponding openings in the printed circuit board.

5. The printed circuit board according to claim 1, wherein the connector further comprises adhesive surfaces on the first side.

6. The printed circuit board according to claim 1, wherein the first opening has at least one insertion aid.

7. The printed circuit board according to claim 1, wherein the first opening has at least one orientation means.

8. The printed circuit board according to claim 1, wherein the connector is made of a non-heat-conducting material.

9. An assembly comprising the printed circuit board according to claim 1 and the at least one conductor of the line, wherein the connector is in the assembled state on the printed circuit board and the at least one conductor of the line is in the inserted state.

10. The printed circuit board according to claim 1, wherein, in the assembled state of the connector on the printed circuit board and prior to a soldering operation, the at least one conductor is pre-secured in the first opening by frictional or adhesive forces to the at least one solder pad and not by a soldered connection.

11. The printed circuit board according to claim 1, further comprising a third opening formed on the third side, wherein a medium is suppliable to the at least one conductor and to the at least one solder pad through the third opening.

12. The printed circuit board according to claim 11, wherein the third opening has or forms a repository for the medium.

13. A method for connecting a printed circuit board, which comprises at least one solder pad, to at least one conductor of a line, the method comprising:
   a) arranging a connector at a predetermined position on the printed circuit board, wherein one or more fasteners of the connector engage with the printed circuit board, and the at least one solder pad is arranged in a recess in the connector; then
   b) inserting the at least one conductor into a first opening in the connector; and then
   c) introducing heat through a second opening in the connector such that the at least one inserted conductor is connected to the at least one solder pad with which it is in contact.

14. The method according to claim 13, in which, during the step of inserting the at least one conductor, the at least one conductor is pushed, at least in part, into the at least one solder pad.

15. The method according to claim 13, wherein insertion movement of the inserting of the at least one conductor is directed along the printed circuit board plane such that the at least one conductor, in an inserted state, is in contact with a solder pad inside the connector.

16. The method according to claim 13, wherein the at least one conductor comprises a core, a stranded core or a wire of the line, and wherein, in an assembled state of the connector on the printed circuit board, a height of the first opening corresponds to a diameter of the at least one conductor.

17. The method according to claim 13, further comprising the step of:
   introducing a medium that assists the connection between the at least one solder pad and the at least one inserted conductor.

18. The method according to claim 17, wherein the medium is introduced through a third opening in the connector.

* * * * *